United States Patent
Nagato et al.

(10) Patent No.: US 6,336,971 B1
(45) Date of Patent: Jan. 8, 2002

(54) METHOD AND APPARATUS FOR PRODUCING SILICON CARBIDE SINGLE CRYSTAL

(75) Inventors: Nobuyuki Nagato; Kunio Komaki; Isamu Yamamoto; Naoki Oyanagi, all of Chiba; Shigehiro Nishino, Kyoto, all of (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/508,427
(22) PCT Filed: Sep. 11, 1998
(86) PCT No.: PCT/JP98/04128
  § 371 Date: Mar. 13, 2000
  § 102(e) Date: Mar. 13, 2000
(87) PCT Pub. No.: WO99/14405
  PCT Pub. Date: Mar. 25, 1999

(30) Foreign Application Priority Data
Sep. 12, 1997 (JP) .............................. 9-248916

(51) Int. Cl.$^7$ .............................................. C30B 29/36
(52) U.S. Cl. ..................... 117/109; 117/84; 117/88; 117/104; 117/951
(58) Field of Search .................. 117/84, 109, 88, 117/104, 951

(56) References Cited

U.S. PATENT DOCUMENTS

| | | | | |
|---|---|---|---|---|
| 3,147,159 A | * | 9/1964 | Lowe | 117/951 |
| 4,543,240 A | * | 9/1985 | Goldberger | 423/346 |
| 4,866,005 A | | 9/1989 | Davis et al. | |
| 5,985,024 A | * | 11/1999 | Balakrishna et al. | 117/84 |
| 6,045,613 A | * | 4/2000 | Hunter | 117/84 |
| 6,056,820 A | * | 5/2000 | Balakrishna et al. | 117/200 |

FOREIGN PATENT DOCUMENTS

| | | |
|---|---|---|
| GB | 1031783 A | 6/1966 |
| JP | 6-316499 | 11/1994 |
| JP | 9-268099 A | 10/1997 |

OTHER PUBLICATIONS

International Search Report.

* cited by examiner

Primary Examiner—Robert Kunemund
(74) Attorney, Agent, or Firm—Sughrue Mion, PLLC

(57) ABSTRACT

A silicon carbide single crystal is produced by allowing a vapor evaporated from a silicon raw material to pass through a heated carbon member and then reach a seed crystal substrate on which a silicon carbide single crystal grows. For this production, an apparatus is used, which has a reaction tube, a heating device and a graphite crucible, wherein the lower part of the crucible constitutes a silicon raw material-charging part; a seed crystal substrate is situated at the top of the crucible; and a carbon member, through which the vapor evaporated from a silicon raw material in capable of passing, is disposed intermediately between the silicon raw material-charging part and the seed crystal. As the carbon member, a porous carbon structure, a carbon plate having a plurality of through holes and a carbon particle-packed layer can be mentioned.

15 Claims, 2 Drawing Sheets

METHOD AND APPARATUS FOR PRODUCING SILICON CARBIDE SINGLE CRYSTAL

TECHNICAL FIELD

This invention relates to a process for producing a silicon carbide single crystal by allowing a vapor evaporated from a silicon raw material to react with a carbon material, and an apparatus for producing a silicon carbide single crystal. More particularly, it relates to a process for producing a silicon carbide single crystal by passing a vapor evaporated from a silicon raw material through a carbon member and bringing the vapor into contact with a seed crystal to thereby allow the silicon carbide single crystal to grow.

By the present invention, a high-quality and large-size silicon carbide single crystal can be produced continuously at a high rate under stabilized conditions.

BACKGROUND ART

Silicon carbide is a semiconductor material characterized as being thermally and chemically very stable and having a wide electronic energy band gap, and is used as a material for an environment-resistant element, a radiation-resistant element, a power element for controlling an electric power, and a short-wavelength light emitting element, which can be used even under high-temperature conditions.

A silicon carbide single crystal is usually produced by a sublimation technique (For example, see Japanese Patent Publication (Kouhyou) No. H3-501118). In the sublimation technique, a powdery silicon carbide raw material and a seed crystal are placed in a graphite crucible so as to confront each other and heated to a temperature of 1,800 to 2,400° C. in an inert gas atmosphere. By the heating, the powdery silicon carbide raw material is decomposed and sublimed, and chemical species generated by sublimation reach the surface of the seed crystal maintained at a growth temperature where silicon carbide epitaxially grows as a single crystal. The composition of the sublimation vapor during the growth of a single crystal varies depending upon factors such as the decomposition and sublimation process of the silicon carbide crystal raw material, interaction among sublimation vapor components in the vapor phase, and contact reaction of silicon carbide with graphite on the inner wall of the reaction device. Proposals for suppressing the variation have been made which include, for example, a method of incorporating a silicon component or a carbon component in the powdery silicon carbide raw material, and a method of coating the inner wall of a crucible with tantalum.

To produce a silicon carbide single crystal having an enhanced crystallizability and homogeneity, a sublimation process using a powdery silicon carbide raw material with a high purity prepared by allowing silicon to react with carbon has been proposed (Japanese Unexamined Patent Publication No. H6-316499).

The decomposition and sublimation vapor generated from a powdery silicon carbide contains Si, $Si_2C$, $SiC_2$ and others. As the amount of silicon components in the sublimation vapor is equimolar or more to the amount of carbon components, the composition of the powdery raw material gradually varies so that the amount of carbon increases. Thus, the partial pressure of the species contained in the sublimation vapor varies with time in the course of sublimation. The change in the composition of the sublimation vapor during the growth of the single crystal leads to reduction of crystallizability such as a crystal defect and a polymorphic mixing. A matter of importance is how to control these variation factors. In the process of crystallization into a silicon carbide crystal, various chemical species in the sublimation vapor naturally take different reaction routes. The reaction routes taken are considered to greatly depend on factors such as temperature of the raw material, variation of temperature distribution, reaction scheme of decomposition of silicon carbide raw material, and variation with time of the composition of raw material and others. These factors are difficult to control and therefore a silicon carbide single crystal having a high quality is difficult to prepare under stabilized conditions. The content of silicon in the vapor phase is liable to decrease in the course of growth of a single crystal as mentioned above, and thus, when the crystal growth is continued over a long period of time, deposition of a silicon carbide single crystal stops due to shortage of silicon in the vapor phase. Also, the composition of the powdery silicon carbide raw material varies so that the content of silicon decreases with time and finally the deposition of a silicon carbide single crystal stops. When the deposition of the single crystal stops, sublimation residue of the powdery silicon carbide raw material must be disposed. Therefore utilization efficiency of raw material in low and a continuous production is difficult to conduct. In addition, a powdery silicon carbide raw material having a high purity which is suitable for a single crystal with a high purity and a high quality used for semiconductors is difficult to prepare and is expensive.

A method of reacting silicon vapor with carbon to allow a silicon carbide single crystal to grow is known. As examples of such method, there can be mentioned (1) a method wherein silicon to used as a raw material, and silicon vapor evaporated from the silicon raw material within a graphite crucible is fed into a silicon carbide deposition chamber where the silicon vapor is brought into contact with carbon vapor generated from a graphite inner wall of the chamber whereby a silicon carbide single crystal grows (Japanese Examined Patent Publication No. S51-8400); (2) a method wherein silicon vapor as a raw material is brought into contact with a carbon plate to deposit a silicon carbide single crystal (U.S. Pat. No. 3,147,159); and (3) a method wherein silicon is used as a raw material, and silicon vapor evaporated therefrom within a graphite reaction tube is allowed to react with carbon vapor evaporated from the inner wall of the graphite reaction tube, to deposit a silicon carbide membrane on a silicon carbide single crystal plate placed within the graphite reaction tube (British Patent No. 1,031,783).

In the methods described in Japanese Examined Patent Publication No. S51-8400 and U.S. Pat. No. 3,147,159, growth of silicon carbide crystals proceeds on naturally occurring nuclei of silicon carbide crystal on the graphite wall, and a multiplicity of single crystals in a leaf form are formed, and thus, a silicon carbide single crystal having a large size cannot be obtained.

In the method described In British Patent No. 1,031,783, the composition of the vapor phase can be maintained at constant, but, the contact area of silicon vapor with the inner wall of the reactive tube is small, and thus, the growth rate of silicon carbide single crystal is low, i.e., not higher than 0.3 mm/hr. Further, because the reactive tube itself is a raw material, the quantity of raw material is restricted and a single crystal having a large size cannot be produced. And, because continuous supply of a raw material cannot be affected in said method, it cannot be adopted for a process for producing a bulk single crystal.

DISCLOSURE OF THE INVENTION

In view of the problems of the foregoing prior art, an object of the present invention is to provide a process for producing a silicon carbide single crystal having a large size and high quality in a continuous manner, at a high rate and under stabilized conditions.

Another object is to provide an apparatus suitable for carrying out the above-mentioned production process.

To achieve the above-mentioned objects, the inventors have conducted extensive researches into a method for evaporating silicon to react with carbon to allow a silicon carbide single crystal to grow. As the results of the researches, it was found that a silicon carbide single crystal having high quality and a large size can be grown at a high rate by using high-purity silicon and carbon as raw materials, situating a seed crystal, making larger the contact area between silicon vapor and carbon and conducting the crystal growth under appropriate pressures. The present invention has been completed based on this finding.

Thus, in accordance with the present invention, there is provided a process for producing a silicon carbide single crystal wherein a silicon carbide single crystal in allowed to grow on a seed crystal substrate, characterized by allowing a vapor evaporated from a silicon raw material to pass through a heated carbon member and reach the seed crystal substrate.

Further, in accordance with the present invention, there is provided an apparatus for producing a silicon carbide single crystal comprising a reaction tube, a heating device and a graphite crucible situated in the reaction tube, characterized in that the lower part of the graphite crucible constitutes a silicon raw material-charging part; a seed crystal substrate is situated at the top of the graphite crucible; and a carbon member, through which a vapor evaporated from the silicon raw material is capable of passing, is disposed at an intermediate position between the silicon raw material-charging part and the seed crystal.

BEST MODE FOR CARRYING OUT THE INVENTION

Figure 1:
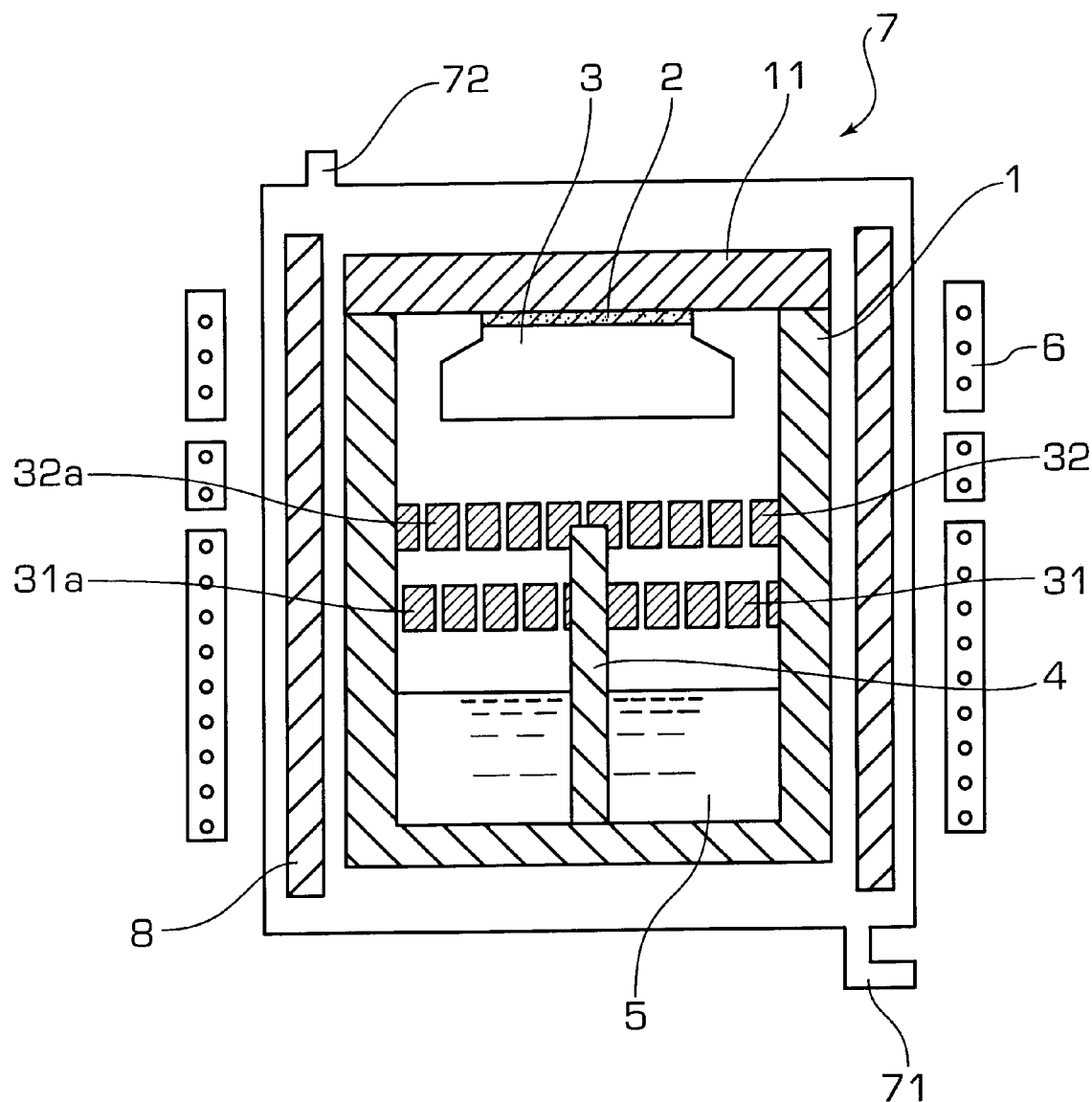
FIG. 1 is a cross-sectional view illustrating an example of the apparatus of the invention for producing a silicon carbide single crystal.

In the process of the invention, a vapor evaporated from a silicon raw material is allowed to pass through a heated carbon member to reach a seed crystal substrate whereby a silicon carbide single crystal grows on the seed crystal substrate.

The seed crystal substrate used to preferably composed of a silicon carbide crystal having the same crystal structure as that of the silicon carbide single crystal to be produced. The crystal growth face utilized in not particularly limited, and any face may be utilized. For example, C-axis perpendicular face ({0001} face), C-axis parallel face ({1100} face) and off-angle introduced face. The growth face of the seed crystal substrate is preferably polished to be flat and smooth so that a single crystal having high quality grows.

Although the seed crystal substrate is located apart from a carbon member so as not to be in contact with each other, the substrate is preferably situated as close as possible to the carbon member so that change of the reactive vapor does not occur during the transfer and the growth face of crystal is kept clean. Where the seed crystal substrate or the carbon member Is gradually moved in a withdrawing direction so that a constant distance is kept between the substrate and the carbon member as a single crystal grows, the crystal growth conditions can be stabilized and thus a homogeneous single crystal can be produced. Where the seed crystal substrate is rotated, the temperature and the composition of vapor become uniform and undesirable growth of crystal can be prevented or minimized.

The seed crystal substrate is usually maintained at a temperature in the range of 1,500 to 2,500° C., preferably 1,700 to 2,300° C. When the temperature of seed crystal to lower than 1,500° C. or higher than 2,500° C., undesirable incorporation of polymorphic crystals in the single crystal is liable to occur.

The silicon raw material used is preferably of high purity so that suppression of crystal defects and control of valence electron can easily be effected. For example, a semiconductor-grade silicon raw material is preferred. Impurities may be doped, if desired, and this can easily be performed by incorporating a dopant element in the raw material part or using a previously doped silicon raw material.

The silicon raw material is heated to a melting point or higher to generate silicon vapor. The heating of silicon raw material is carried out by, for example, charging a graphite crucible with the silicon raw material and heating the graphite crucible by a high-frequency heater or other heating means.

The graphite crucible is placed in a reaction tube which is designed so that an inert gas such as argon can be introduced therein and the pressure within the reaction tube can be controlled. By coating the inner wall of the graphite crucible, undesirable reaction of the inner wall of the crucible with molten silicon or silicon vapor can be prevented or minimized. As the coating material, a heat-resistant material much as silicon carbide and tantalum carbide is preferably used.

In the present invention, even when the total pressure within the reaction tube (which is approximately the same as the total pressure within the crucible) is varied in a broad range, the growth of a silicon carbide single crystal can be performed. However, the total pressure within the reaction tube is preferably maintained in the range of a highly reduced pressure to a pressure slightly higher than the normal pressure, namely, from 0.01 to 1,000 Torr. In view of the rate of crystal growth, the total pressure is more preferably in the range of 0.1 to 760 Torr. The rate of evaporation of silicon can be controlled by the difference of the partial pressure of silicon vapor from the total pressure, or by the partial pressure of silicon vapor. The partial pressure of silicon vapor is preferably in the range of 0.01 to 300 Torr. This preferable pressure range is obtained usually by heating the silicon raw material at a temperature of 1,450 to 2,200° C., preferably 1,500 to 2,000° C. When the heating temperature is lower than 1,450° C., the evaporation rate of silicon is low and the deposition rate of silicon carbide also to low. When heating temperature exceeds 2,200° C., a problem arises in the material constituting the apparatus because the temperature of the carbon member is higher than that of the silicon raw material.

The process of the invention can be carried out in a continuous manner by continuously or intermittently supplying the silicon raw material for compensating the consumed silicon. The silicon raw material may be supplied either in the form of a melt or a powder. In the case of a melt, it can be supplied by forcing, for example, by using an inert gas. In the case of a powder, it can be supplied continuously or intermittently, for example, by using a screw-conveyor or vibrating feeder. In this case, to maintain the atmosphere within the crucible at high purity, it is preferable that the powdery raw material is first introduced into a pre-treating chamber which is then vacuumed and the inside gas atmosphere is exchanged with the same gas (for example, argon gas) as that for the atmosphere of crystal growth, and the thus-treated powdery raw material is supplied into the graphite crucible.

A silicon vapor evaporated from the raw material is brought into contact with a heated carbon member. The carbon member may be composed of various carbonaceous materials spanning from amorphous carbon to graphite. A high-purity carbon is preferably used for yielding a high-quality silicon carbide single crystal. The high-purity carbon can be prepared by removing impurities by high-temperature calcination or reaction with a halogen gas.

The structure of the carbon member is not particularly limited provided that silicon vapor is capable of passing through the carbon member so that good contact between the carbon member and silicon vapor can be obtained for conducting the reaction of silicon vapor with carbon with an enhanced efficiency. As examples of the structure of the carbon member, there can be mentioned a porous carbon structure, a carbon plate having a plurality of through-holes, a layer packed with carbon particles, and a combination of at least two of these structures. The void ratio of the porous carbon member and the carbon plate having through-holes as defined by the following equation is preferably in the range of about 50 to 98%.

$$\text{Void ratio (\%)}=(\text{true density}-\text{bulk density})/\text{true density} \times 100$$

Note, in the case when the carbon member used is of a multi-layer form, the inter-layer space Volume is excluded for the determination of true density and bulk density for calculation of the void ratio. When the void ratio is smaller than 50%, the volume rate of the gas flow passing through the carbon member is small and the rate of crystal growth becomes undesirably low. In contrast, when the void ratio is larger than 98%, the carbon member is very bulky and frequency for exchanging the carbon member during operation increases.

Carbon particles constituting the vapor-permeable carbon particles-packed layer include primary particles and aggregates thereof, and granules. In view of ease in handling, difficulty in flying and the size of contact area, the carbon particles preferably has an average particle diameter of about 100 $\mu$m to 20 mm. When the particle diameter distribution is broad, the vapor is liable to pass mainly through inter-spaces among large particles and the permeability to vapor is not uniform over the entire carbon particles-packed layer, and thus reaction of carbon with silicon vapor proceeds nonuniformly. Therefore a narrow particle diameter distribution is preferable. More specifically the particle diameter distribution is preferably such that at least 90% in number of the carbon particles have a particle diameter not larger than twice of the average particle diameter.

The void ratio of the carbon particle-packed layer as defined by the equation void ratio (%)=(true density−bulk density of the carbon particle-packed layer)/true density× 100 is preferably in the range of about 30 to 70%. When the void ratio is smaller than 30%, the volume rate of the gas flow passing through the carbon member is low and the rate of crystal growth becomes undesirably low. In contrast, when the void ratio is larger than 70%, minute carbon particles are liable to fly and be deposited on the surface of growing crystal leading to deterioration of crystal quality.

For forming the carbon particle-packed layer within a graphite crucible, a support is used. The structure and shape of the support used is not particularly limited provided that the support can support carbon particles and can be permeable to vapor. For example, a plate with through holes each having a diameter such that carbon particles are incapable of passing through the through holes, or a not can be used. The material constituting the support in such that the material in not molten at the temperature at which the carbon particles react with silicon, and, as examples of the material, there can be mentioned carbon; high-melting-point metals such as tantalum, tungsten, niobium, molybdenum, rhenium and osmium; high-melting-point carbides such as tantalum carbide and silicon carbide; high-melting-point borides such as tantalum boride and tungsten borides; and high-melting-point nitrides such as tantalum nitride.

The carbon member to usually disposed above the raw material silicon charged within the graphite crucible. A plurality of carbon members can be disposed in a multi-stage so that they form a multi-layer structure through which a silicon-containing vapor passes upwardly in turn. When carbon plates with through holes or porous carbon plates are used as the carbon members, it is preferable that each through-hole in a first carbon plate and any through-hole in the adjacent second carbon plate are not aligned so that the silicon-containing vapor having passed through the first plate cannot penetrate linearly into the through holes of the adjacent second plate, but impinges on the adjacent second plate and follows a crank-shaped path to attain a sufficient contact of silicon with carbon. When carbon particles are used, they are preferably charged in a plurality of perforated disk plates which are disposed so as to form a multi-layer structure to enlarge a contact area of the silicon vapor with carbon.

As mentioned above, a plurality of carbon members forming a multi-layer structure can be used, but, the uppermost layer thereof can be substituted by a silicon carbide particle-packed layer. When the uppermost silicon carbide particle-packed layer is used, silicon-containing gases such as Si, $Si_2C$ and $SiC_2$, can be introduced into the atmosphere between the seed crystal and the carbon members while a silicon-containing vapor moves upward to reach the carbon members, and thus, sublimation of seed crystal and formation of surface inclusion on the growing crystal can be avoided. Further, carbon raw material is continuously supplied to the second layer and lower layers, whereby carbon dust, produced when powdery carbon is supplied, can be prevented from being deposited onto the surface of seed crystal.

The carbon member is maintained usually at a temperature of at least 1,600° C. and higher than the temperature of seed crystal, and preferably at a temperature of 1,700 to 2,800° C.

The carbon raw material also can be replenished either continuously or intermittently. In order to maintain the desired purity in the atmosphere within the graphite crucible, it to preferable that the carbon raw material to previously introduced into a pre-treating chamber which to then vacuumed and the inside gas atmosphere is exchanged with the same gas (for example, argon gas) as that for the atmosphere of crystal growth, and the thus-treated carbon raw material is supplied into the graphite crucible.

One or both of the carbon raw material and the silicon raw material can be supplied continuously or intermittently.

Alternatively, the carbon raw material and the silicon raw material can be supplied in a batchwise manner.

The mechanism of the growth of a silicon carbide single crystal, namely, the mechanism of the process wherein silicon vapor from the silicon raw material-packed part is brought into contact with the carbon member and is deposited an a silicon carbide single crystal on the seed crystal substrate, is complicated. However, it is considered that the silicon vapor generated from the raw material silicon-packed part is brought into contact with the carbon member or the carbon vapor to form a vapor phase containing chemical species such as Si, $Si_2C$ and $SiC_2$. By appropriately choosing the temperature of silicon raw material, the temperature of carbon raw material and the total pressure of the entire atmosphere including an inert argon gas, the composition of the chemical species in the vapor phase and the partial pressures thereof can be determined. Therefore, the change of the chemical species in the vapor phase as observed in the sublimation process of the prior art can be avoided in the process of the invention, and consequently, a silicon carbide single crystal is capable of stably growing on the surface of seed crystal substrate by appropriately choosing the above-mentioned temperature conditions, and the volume and structure of an apparatus used.

In order to produce a single crystal bulk having good quality and a large size according to the invention, the growth of a single crystal can be continued by repeating the operation while the raw material silicon and the raw material carbon are newly exchanged or replenished. That is, when the as-produced single crystal is used as a seed crystal substrate, a single crystal having an enhanced diameter can be obtained. When a seed crystal substrate out from the as-produced single crystal is newly disposed and the operation is conducted, a high-grade single crystal having much reduced crystal defects can be grown.

The apparatus of the invention will be described with reference to the attached drawings.

In FIG. 1 illustrating one example of the production apparatus of the invention, a graphite crucible 1 having a lid 11 is placed within a reaction tube 7. The lower part of the crucible 1 is charged with a silicon raw material 5. Two carbon members 31 and 32 each in a plate form are disposed above the silicon raw material-charged part of the crucible 1. The carbon members 31 and 32 have through holes 31a and 32a, respectively, through which the sublimation silicon vapor passes. The through holes 31a of plate 31 and the through holes 32a of plate 32 are disposed so that each of the through holes 31a and any of the through holes 32a are not aligned so that the silicon-containing vapor having passed through the plate 31 cannot penetrate linearly into the through holes 32a of the plate 32, namely, the silicon-containing vapor follows a crank-shaped path to attain a sufficient contact of silicon with the carbon plates. The carbon plates 31 and 32 are supported by a support 4, which is preferably made of graphite. The carbon members used in the invention are not limited to those which are of a plate form having through holes, as illustrated in FIG. 1, and can be a porous plate having open pores or a carbon particle-packed layer or layers, or a combination thereof. A carbon member having high permeability to silicon-containing vapor are preferable. The carbon member may form a single carbon layer, but preferably forms a multi-layer.

A silicon carbide seed crystal substrate 2 is situated above the carbon members within the graphite crucible 1, for example, the seed crystal substrate 2 is fixed onto the lower surface of the lid 11. The silicon-containing sublimation vapor evaporated from the silicon raw material 5 passes through the heated carbon members 31 and 32 and reacts with carbon to form a silicon carbide single crystal 3 growing on the seed crystal substrate 2. The reaction tube 7 is equipped with a heating furnace 6 such as a high-frequency heater outside the reaction tube. The heating furnace 6 preferably has a structure such that the temperatures of the silicon raw material 5, the carbon members 31 and 32 and the seed crystal substrate 2 within the graphite crucible 1 can be independently controlled. More specifically the high-frequency heater 6 has a high-frequency coil (not shown) wound at varied winding densities around the reaction tube 7, or high-frequency coils provided separately as illustrated in FIG. 1 which are situated so as to heat independently the silicon raw material, the carbon members and the seed crystal substrate within the crucible 1 to form a desired temperature gradient over the entire parts within the crucible.

The graphite crucible 1 is placed within the reaction tube 7 made of quarts or other material provided with the heating furnace 6. A heat insulator 8 made of, for example, graphite felt is placed for heat insulation. The reaction tube is provided with an inlet 72 for introducing an inert gas such as argon and an exhaust vent 71. The inner pressure within the graphite crucible is controlled by sucking the gas through the exhaust vent 71. The wall of the graphite crucible 1 usually has permeability to air and thus an inert gas can permeates the crucible.

Figure 2:
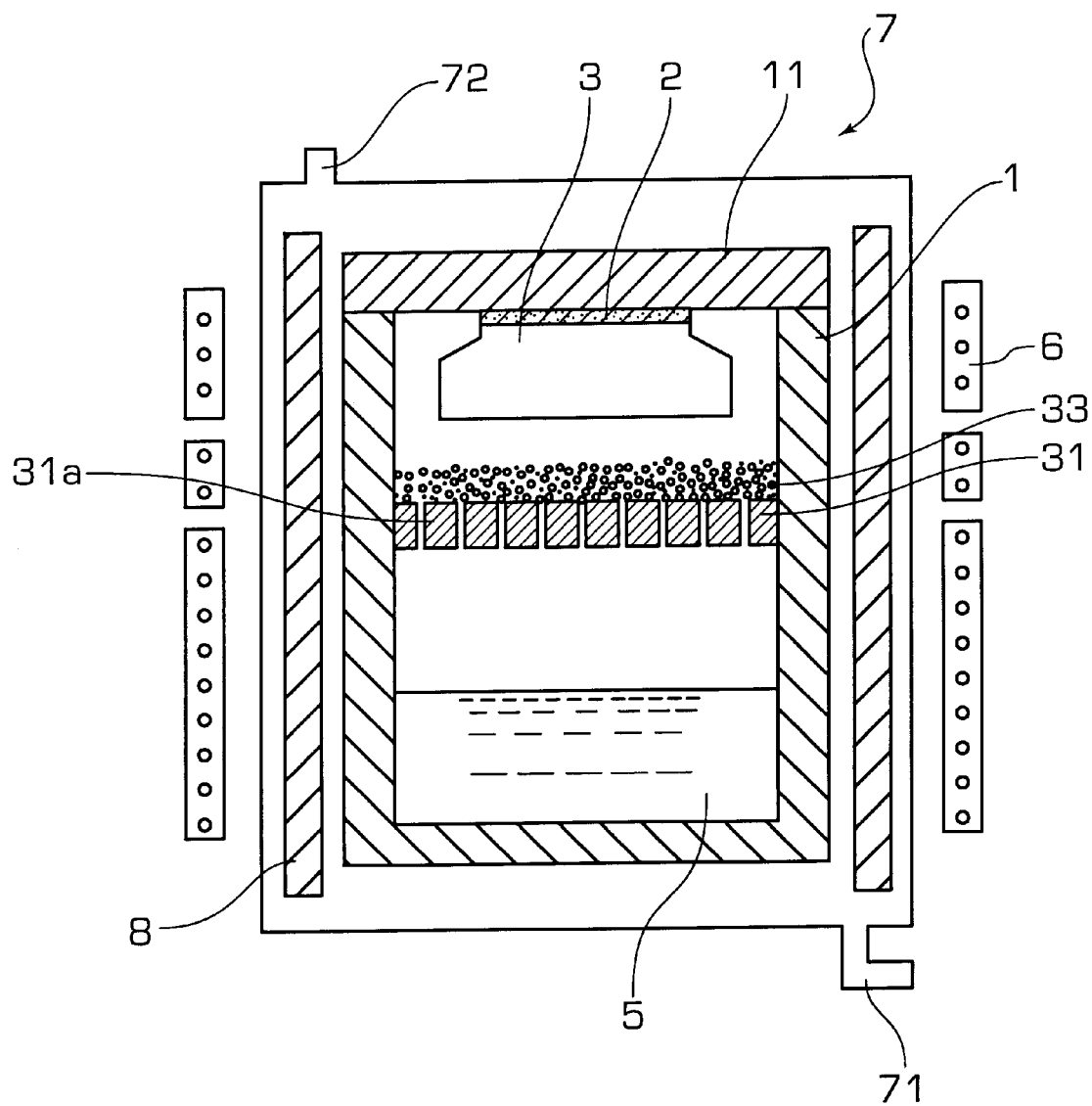
FIG. 2 is a cross-sectional view illustrating another example of the apparatus of the invention for producing a silicon carbide single crystal.

FIG. 2 illustrates another example of the production apparatus of the invention. In this apparatus, the carbon member consists of a carbon plate 31 having a plurality of through holes 31a and carbon particles 33 packed on the carbon plate 31, and this apparatus has no support for supporting the carbon member. The other constitutions are the same as those of the apparatus Illustrated in FIG. 1.

The invention will now be described by the following examples that by no means limit the scope of the invention.

EXAMPLE 1

A silicon carbide single crystal was produced by using the apparatus shown in FIG. 1.

A seed crystal substrate with a diameter of 20 mm and a thickness of 2.5 mm, which had a 6H-silicon carbide single crystal (0001) face as a growing substrate, was fixed to the center on the lower surface of the lid of the graphite crucible. As shown in FIG. 1, 150 g of semiconduotor-grade silicon carbide crystal pieces were charged in the lower part of the graphite crucible. The graphite crucible had a diameter of 46 mm and a height of 120 mm. Two carbon plates each having a thickness of about 10 mm were fitted with a space of 3 mm to the graphite crucible at a position of approximately half-height of the crucible. The carbon plates were made of a material having a void ratio of 23% and had through holes having a diameter of 1.5 mm perforated at an interval of 5 mm. The through holes of the two plates were situated so as not to be aligned, and the through holes of the two plates formed cranked paths.

The graphite crucible was set in a quartz tube provided within a high-frequency furnace. The inside of the reaction tube was vacuumed to a pressure of 0.001 Torr, and then, heated to a temperature of 1,450° C. and maintained at this temperature for 30 minutes to effect a heat treatment. Thereafter, the temperature of the silicon raw material was elevated to 1,850° C., the temperature of the carbon plates war& elevated to about 2,200° C., and the temperature of the seed crystal was elevated to 2,100° C. Argon gas was introduced into the reaction tube, and the operation was conducted for 3 hours while the argon atmosphere was maintained at a pressure of 95 Torr.

At this time, the leading end of the growing single crystal had a cross-section of a nearly circular shape with a diameter of 40.3 mm and the single crystal had a height of 8.6 mm. This crystal was out in cross-section in the growing direction, and polished. Observation of the polished surface by a microscope revealed that inclusion was not contained at all and 30 crystal defects were found per $cm^2$. From the position of a peak obtained by the Raman spectroscopy, the crystal was proved to be a 6H—SiC single crystal completely free from other incorporated polymorphic crystals.

EXAMPLE 2

A silicon carbide single crystal was produced by using the apparatus shown in FIG. 1.

A seed crystal substrate with a diameter of 10 mm and a thickness of 0.3 mm, which had a 6H-silicon carbide single crystal (0001) face as a growing substrate, was fixed to the center on the lower surface of the lid of the graphite crucible. As shown in FIG. 1, 150 g of semiconductor-grade silicon carbide crystal pieces were charged in the lower part of the graphite crucible. The graphite crucible had a diameter of 46 mm and a height of 120 mm. Two carbon plates each having a thickness of about 10 mm were fitted with a space of 3 mm to the graphite crucible at a position of approximately half-height of the crucible. The carbon plates were made of a material having a void ratio of 23% and had through holes having a diameter of 1.5 mm perforated at an interval of 5 mm. The through holes of the two plates were situated so as not to be aligned, and the through holes of the two plates formed cranked paths.

The graphite crucible was set in a quartz tube provided within a high-frequency furnace. The inside of the reaction tube was vacuumed to a pressure of 0.001 Torr, and then, heated to a temperature of 1,450° C. and maintained at this temperature for 30 minutes to effect a heat treatment. Thereafter, argon gas was introduced into the reaction tube until the argon atmosphere reached a pressure of 95 Torr. The temperature of the silicon raw material was elevated to 1,800° C. the temperature of the carbon plates were elevated to about 2,400° C., and the temperature of the seed crystal was elevated to 2,100° C., and the operation was conducted for 10 hours.

At this time, the leading end of the growing single crystal had a cross-section of a nearly circular shape with a diameter of 15 mm and the single crystal had a height of 6.6 mm. This crystal was cut in cross-section in the growing direction, and polished. Observation of the polished surface by a microscope revealed that inclusion was not contained at all and 30 crystal defects were found per $cm^2$. From the position of a peak obtained by the Raman spectroscopy, the crystal was proved to be a 6H—SiC single crystal completely free from other incorporated polymorphic crystals.

EXAMPLE 3

A silicon carbide single crystal was produced by using the apparatus shown in FIG. 2.

A seed crystal substrate with a diameter of 10 mm and a thickness of 0.3 mm, which had a 6H-silicon carbide single crystal (0001) face as a growing substrate, was fixed to the center on the lower surface of the lid of the graphite crucible. As shown in FIG. 2, 23 g of semiconduotor-grade silicon carbide crystal particles were charged in the lower part of the graphite crucible. The graphite crucible had an outer diameter of 32 mm, a height of 121 mm and a wall thickness of 4 mm. A carbon plate with a thickness of about 2 mm having 21 through holes with a diameter of 3 mm was fitted at a position about 20 mm apart downward from the lid, and 2.4 g of carbon particles having an average particle diameter of 2 mm ("SHOKARISER L"™ supplied by Showa Denko K.K.) were packed on the carbon plate.

The graphite crucible was set in a quartz tube provided within a high-frequency furnace. The inside of the reaction tube was vacuumed to a pressure of 0.01 Torr, and argon gas was introduced until the inside atmosphere reached normal pressure. Then the inside of the tube was vacuumed to a pressure of 0.0005 Torr to remove air from the tube. Argon gas was introduced until the inside atmosphere reached normal pressure, and the graphite crucible was heated and vacuumed to a pressure of 10 Torr. The silicon raw material, the carbon particles and the seed crystal were maintained at temperatures of 1,800° C., 2,400° C. and 2,000° C., respectively, for 3 hours to grow a silicon carbide single crystal.

The single crystal had a height of 3.5 mm. From the position of a peak obtained by the Raman spectroscopy and the peak pattern obtained by the X-ray diffraction, the crystal was proved to be a 6H—SiC single crystal completely free from other incorporated polymorphic crystals.

INDUSTRIAL APPLICABILITY

By the process of the invention wherein a vapor evaporated from a silicon raw material is allowed to pass through a heated carbon member and then to reach a seed crystal substrate on which a silicon carbide single crystal grows, a silicon carbide single crystal having high quality and large size can be continuously produced at a high rate under stabilized production conditions.

A silicon carbide single crystal is a semiconductor material, and is used as a material for an environment-resistant element, a radiation-resistant element, a power element for controlling an electric power, and a short-wavelength light emitting element, which can be used even under high-temperature conditions.

What is claimed is:

1. A process for producing a silicon carbide single crystal wherein a silicon carbide single crystal is allowed to grow on a seed crystal substrate which is composed of a silicon carbide crystal and provided in a reactor, characterized by allowing a vapor evaporated from a silicon raw material to pass through a heated carbon member to reach the seed crystal substrate on which a silicon carbide single crystal grows.

2. A process for producing a silicon carbide single crystal according to claim 1, wherein a silicon carbide single crystal is allowed to grow at an atmosphere pressure in the range of 0.1 to 760 Torr.

3. A process for producing a silicon carbide single crystal according to claim 1, wherein the vapor evaporated from the silicon raw material in moved upward to pass through the carbon member, and is further moved upward to reach the seed crystal substrate.

4. A process for producing a silicon carbide single crystal according to claim 1, wherein the vapor evaporated from the silicon raw material is allowed to pass through the carbon member, which has a multi-layer structure composed of a plurality of carbon material layers, in turn.

5. A process for producing a silicon carbide single crystal according to claim 1, wherein the vapor evaporated from the silicon raw material is allowed to pass through the carbon member, which comprises a porous carbon structure, a carbon plate having a plurality of through holes or a carbon particle-packed layer, or a combination of at least two thereof.

6. A process for producing a silicon carbide single crystal according to claim 5, wherein the porous carbon structure and the carbon plate having through holes have a void ratio of 50 to 98%, and the carbon particle-packed layer has a void ratio of 30 to 70%.

7. A process for producing a silicon carbide single crystal according to claim 1, wherein the heated carbon member in maintained at a temperature higher than that of the silicon raw material.

8. A process for producing a silicon carbide single crystal according to claim 1, wherein the heated carbon member is maintained at a temperature of at least 1,600° C.

9. A process for producing a silicon carbide single crystal according to claim 1, wherein the heated carbon member in maintained at a temperature higher than that of the seed crystal substrate.

10. A process for producing a silicon carbide single crystal according to claim 1, wherein one or both of the silicon raw material and the carbon member are continuously or intermittently supplied.

11. A process for producing a silicon carbide single crystal wherein a silicon carbide single crystal is allowed to grow on a seed crystal substrate composed of a silicon carbide crystal and provided in a reactor, which comprises the steps of (i) allowing a silicon raw material to react with a carbon raw material to generate a vapor, and (ii) allowing the vapor to reach the seed crystal substrate on which a silicon carbide single crystal grows; said steps (i) and (ii) being carried out in a continuous manner.

12. A process for producing a silicon carbide single crystal according to claim 11, wherein a silicon carbide single crystal is allowed to grow in an atmosphere having a pressure in the range of 0.1 to 760 Torr.

13. A process for producing a silicon carbide single crystal according to claim 11, wherein the carbon raw material is maintained at a temperature of at least 1,600° C.

14. A process for producing a silicon carbide single crystal according to claim 11, wherein the carbon raw material is maintained at a temperature higher than that of the seed crystal substrate.

15. A process for producing a silicon carbide single crystal according to claim 11, wherein at least one of the silicon raw material and the carbon raw material is continuously or intermittently supplied into the reactor.

* * * * *